(12) United States Patent
Okada et al.

(10) Patent No.: US 7,355,382 B2
(45) Date of Patent: Apr. 8, 2008

(54) CURRENT SENSOR AND MOUNTING METHOD THEREOF

(75) Inventors: Akira Okada, Tokyo (JP); Junji Miyamoto, Okayama (JP)

(73) Assignees: Mitsubishi Electric Corporation, Tokyo (JP); Kohshin Electric Corporation, Kasaoka-shi (JP)

( * ) Notice: Subject to any disclaimer, the term of this patent is extended or adjusted under 35 U.S.C. 154(b) by 0 days.

(21) Appl. No.: 11/617,452

(22) Filed: Dec. 28, 2006

(65) Prior Publication Data

US 2007/0159159 A1  Jul. 12, 2007

(30) Foreign Application Priority Data

Jan. 12, 2006  (JP)  .............................. 2006-005351

(51) Int. Cl.
  *G01R 15/20* (2006.01)
(52) U.S. Cl. .................................. 324/117 H
(58) Field of Classification Search ............ 324/117 H, 324/117 R, 760, 765, 158.1, 252; 338/32 R, 338/332 H
  See application file for complete search history.

(56) References Cited

U.S. PATENT DOCUMENTS 5,686,837 A * 11/1997 Coehoorn et al. .......... 324/252

5,719,494 A  2/1998 Dettmann et al.
6,998,839 B2 * 2/2006 Doescher .................... 324/252

FOREIGN PATENT DOCUMENTS

| DE | 44 36 876 A1 | 4/1996 |
| EP | 0 707 218 A2 | 4/1996 |
| JP | 8-211138 | 8/1996 |

* cited by examiner

*Primary Examiner*—Ha Tran Nguyen
*Assistant Examiner*—Tung X. Nguyen
(74) *Attorney, Agent, or Firm*—Oblon, Spivak, McClelland, Maier & Neustadt, P.C.

(57) ABSTRACT

A current sensor that can reduce a measurement error due to isotropic elongation or strain owing to temperature and the like. A first half bridge circuit is placed in a first region divided by a center line of a mounting substrate, and a second half bridge circuit is placed in a second region, and the half bridge circuits are equally formed and placed point symmetrically about the central point of the mounting substrate. Even if elongation or strain occurs isotropically in the mounting substrate of magnetoresistive elements owing to temperature, the half bridge circuits undergo the influence of the elongation or strain equally as the bridge circuit. Thus, it can cancel the effect and reduce the measurement error due to the isotropic elongation or strain owing to temperature.

9 Claims, 6 Drawing Sheets

Without External Magnetic Field

Applied External Magnetic Field

CURRENT SENSOR AND MOUNTING METHOD THEREOF

BACKGROUND OF THE INVENTION

1. Field of the Invention

The present invention relates to a current sensor for measuring the current flowing through a current line to be measured and a mounting method thereof.

2. Description of Related Art

As a conventional current sensor, there is one that places a bridge circuit consisting of four magnetoresistive elements mirror symmetrically (see Patent Document 1, for example).

Patent Document 1: Japanese patent application laid-open No. 8-211138/1996.

SUMMARY OF THE INVENTION

With the foregoing configuration, the conventional current sensor has a problem of causing a measurement error because of the lost of the balance between left and right of the bridge circuit placed mirror symmetrically if elongation or strain occurs isotropically on a mounting substrate, on which the four magnetoresistive elements are mounted, because of temperature or the like.

In addition, it has a problem of making it difficult to carry out large current measurement.

Furthermore, since is takes no countermeasures against external electric field, it has a problem of reducing measurement accuracy when a noise source is close.

The present invention is implemented to solve the foregoing problems. It is therefore an object of the present invention to provide a current sensor and mounting method thereof capable of reducing a measurement error due to the elongation or strain of the isotropy because of the temperature or the like.

The current sensor in accordance with the present invention has a first half bridge circuit placed in a first region divided by a center line of a mounting substrate, and a second half bridge circuit placed in a second region, and the first and second half bridge circuits are equally formed and placed point symmetrically about the central point of the mounting substrate.

As described above, according to the present invention, even if elongation or strain occurs isotropically in the mounting substrate of the magnetoresistive elements owing to temperature or the like, the first half bridge circuit and second half bridge circuit undergo the influence of the elongation or strain equally as the bridge circuit. Thus, it can cancel out the effect and reduce the measurement error due to the isotropic elongation or strain owing to temperature or the like.

DETAILED DESCRIPTION OF THE PREFERRED EMBODIMENTS

Embodiment 1

Figure 1:
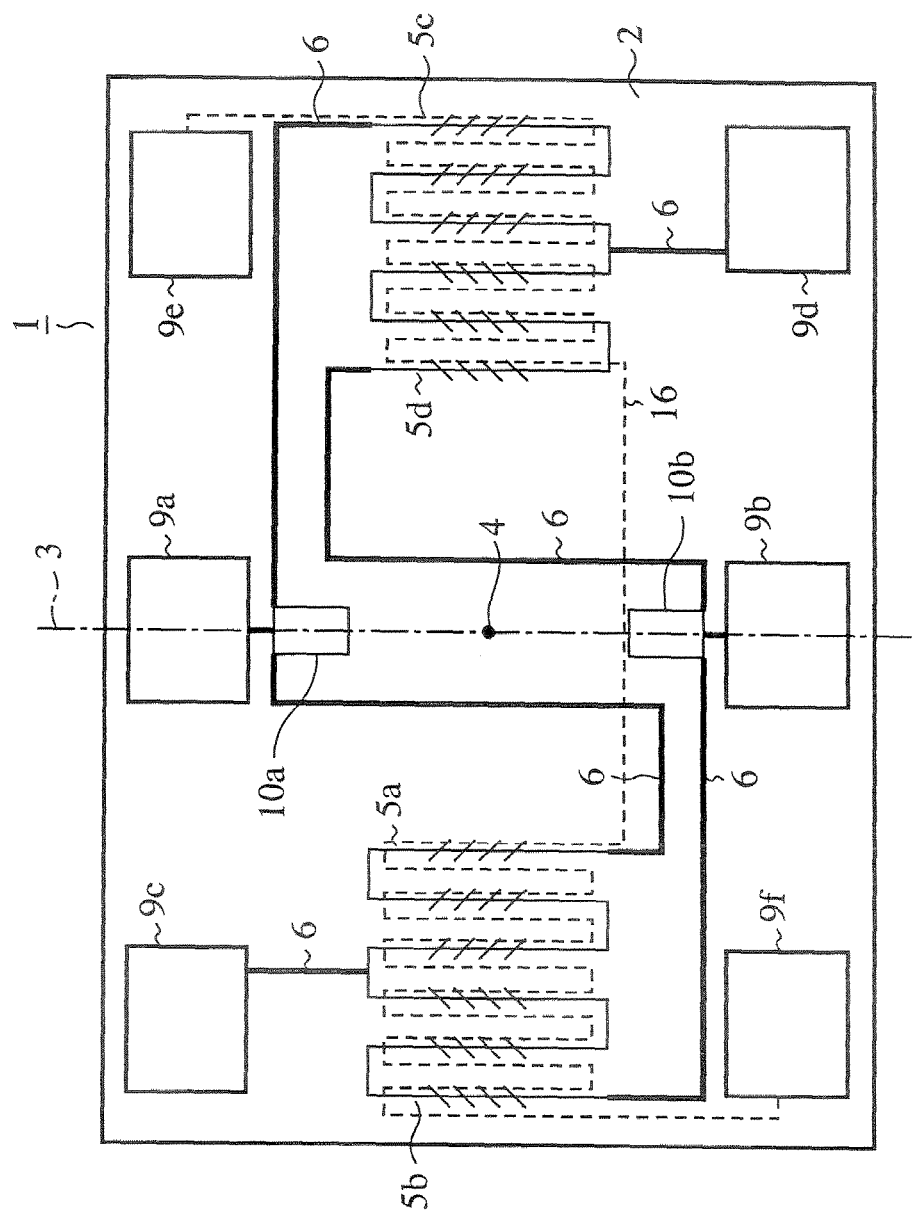
FIG. 1 is a plan view showing the measured current detecting section of the current sensor of an embodiment 1 in accordance with the present invention.

FIG. 1 is a plan view showing the measured current detecting section of the current sensor of an embodiment 1 in accordance with the present invention. In FIG. 1, the measured current detecting section 1 is composed of circuit components which are arranged on a mounting substrate 2 in point symmetry with respect to the central point 4 on the center line 3 of the mounting substrate 2. Four magnetoresistive elements (first to fourth magnetoresistive elements) 5a-5d are placed in parallel to each other with respect to the center line 3 of the mounting substrate 2. A barber pole electrode structure is formed in such a manner that the magnetoresistive elements 5a and 5d have magnetoresistive characteristics of increasing the resistances with an increase of the magnetic fields opposite to each other in directions, and that the magnetoresistive elements 5b and 5c have magnetoresistive characteristics of reducing the resistances with an increase of the magnetic fields opposite to each other in directions. The four magnetoresistive elements 5a-5d are each composed of three magnetoresistive elements formed in a crank-like shape. Thus extending the line length subject to the magnetic field can facilitate detecting the variations in the magnetic field.

Connecting current lines 6 constitute the bridge circuit by interconnecting the four magnetoresistive elements 5a-5d.

Figure 2:
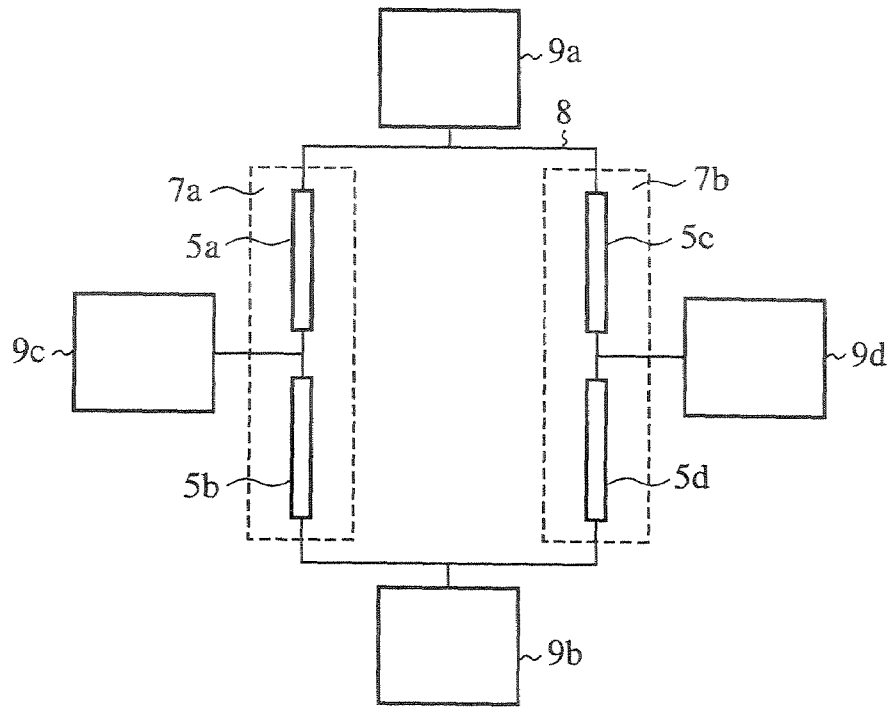
FIG. 2 is a schematic diagram showing a configuration of the measured current detecting section of the current sensor of the embodiment 1 in accordance with the present invention.

FIG. 2 is a schematic diagram showing a configuration of the measured current detecting section of the current sensor of the embodiment 1 in accordance with the present invention. In FIG. 2, By connecting four magnetoresistive elements 5a-5d, a bridge circuit 8 is configured which is composed of a parallel connection of a half bridge circuit (first half bridge circuit) 7a consisting of the series connection of the magnetoresistive elements 5a and 5b and a half bridge circuit (second half bridge circuit) 7b consisting of the series connection of the magnetoresistive elements 5c and 5d. A connecting area (first connecting area) 9a is connected to the connecting current line 6 across the magnetoresistive elements 5a and 5c of the bridge circuit 8, and a connecting area (second connecting area) 9b is connected to the connecting current line 6 across the magnetoresistive elements 5a and 5d of the bridge circuit 8. The connecting areas 9a and 9b are used to supply the bridge circuit 8 with a voltage. A connecting area (third connecting area) 9c is connected to the connecting current line 6 across the magnetoresistive elements 5a and 5b of the bridge circuit 8, and a connecting area (fourth connecting area) 9d is connected to the connecting current line 6 across the magnetoresistive elements 5c and 5d of the bridge circuit 8. The connecting areas 9c and 9d are used to detect the voltage from the bridge circuit 8.

As shown in FIG. 1, a compensating conductive line 16 is placed above or below or both of the four magnetoresistive elements 5a-5d on the mounting substrate 2 via an insulating layer. The compensating conductive line 16 has its first end connected to a connecting area (fifth connecting area) 9e, and its second end connected to a connecting area (sixth connecting area) 9f.

In addition, a control circuit which will be described later supplies not only the connecting areas 9a and 9b with the voltage, but also the connecting areas 9e and 9f with the control current that will counteract the magnetic field generated near the four magnetoresistive elements 5a-5d in response to the voltage of the bridge circuit 8 detected from the connecting areas 9c and 9d.

A magnetoresistive element portion 10a is placed at the connecting section of the connecting the current line 6 with the connecting area 9a between the magnetoresistive elements 5a and 5c to enable adjustment of the resistance of the magnetoresistive elements 5a and 5c. Likewise, a magnetoresistive element portion 10b is placed at the connecting section of the connecting current line 6 with the connecting area 9b between the magnetoresistive elements 5b and 5d to enable adjustment of the resistance of the magnetoresistive elements 5b and 5d.

Thus, the configuration as shown in FIG. 1 is composed of the circuit components which are arranged on the mounting substrate 2 in point symmetry with respect to the central point 4 of the mounting substrate 2 as described above.

More specifically, the half bridge circuits 7a and 7b, which are composed of the four magnetoresistive elements 5a-5d and connecting current lines 6 constituting the bridge circuit 8, are placed point symmetrically about the central point 4; the connecting areas 9a and 9b are placed point symmetrically about the central point 4; the connecting areas 9c and 9d are placed point symmetrically about the central point 4; the connecting areas 9e and 9f are placed point symmetrically about the central point 4; the magnetoresistive element portions 10a and 10b are placed point symmetrically about the central point 4; and the connecting current line 6 connecting the connecting area 9c and the magnetoresistive elements 5a and 5b and the connecting current line 6 connecting the connecting area 9d and the magnetoresistive elements 5c and 5d are placed point symmetrically about the central point 4.

Next, the operation will be described.

First, the basic operation of the magnetoresistive elements will be described.

The magnetoresistive elements utilize the phenomenon that the resistance of the ferromagnetic material varies in accordance with the angle between the direction of magnetization of the ferromagnetic material and the direction of the current flowing through the ferromagnetic material.

Figure 3:
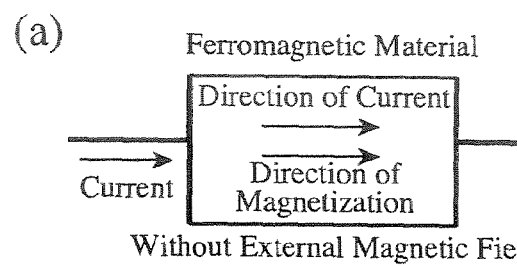
FIGS. 3(a) and 3(b) are diagrams illustrating the direction of magnetization in a ferromagnetic material and the direction of the current flowing through the ferromagnetic material with and without an external magnetic field being applied, respectively.
Figure 3:
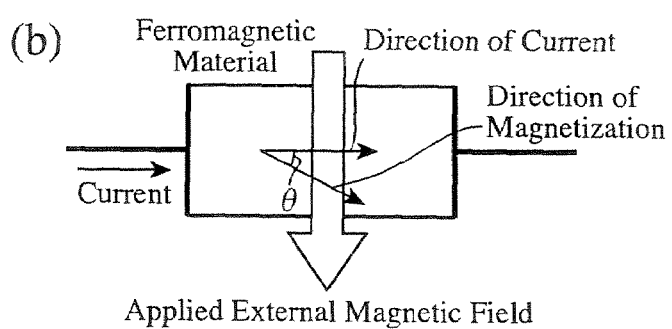

FIG. 3(a) is a diagram illustrating the direction of magnetization in the ferromagnetic material and the direction of the current flowing through the ferromagnetic material when no external magnetic field is applied; FIG. 3(b) is a diagram illustrating the direction of magnetization in the ferromagnetic material and the direction of the current flowing through the ferromagnetic material when an external magnetic field is applied; and FIG. 4 is a characteristic diagram illustrating variations in the resistance of the ferromagnetic material against the angle θ between the direction of the magnetization and the direction of the current.

As is seen from FIGS. 3(a) and (b), the direction of magnetization in the ferromagnetic material is affected by the intensity and direction of the external magnetic field. Thus, the external magnetic field can be obtained from the resistance of the ferromagnetic material.

Figure 4:
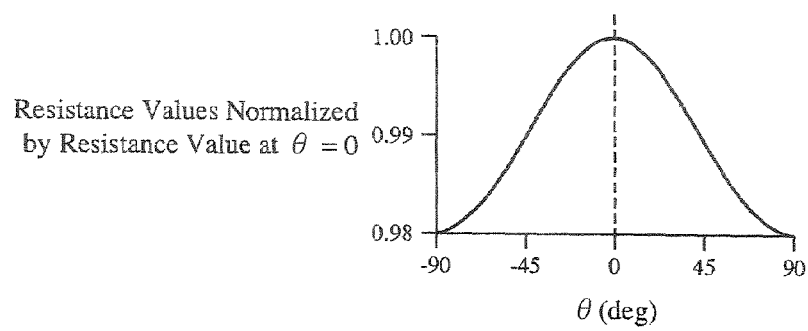
FIG. 4 is a characteristic diagram illustrating variations in the resistance of the ferromagnetic material against an angle θ between the direction of the magnetization and the direction of the current.

In addition, as is seen from FIG. 4, the resistance exhibits the maximum variation with respect to the direction of magnetization when the angle θ is 45 (degrees). Besides, when the angle θ is 45 (degrees), the resistance varies most linearly against the variations in the angle θ. Accordingly, to detect the magnetic field using the magnetoresistive elements, a contrivance is made in such a manner that the angle θ becomes 45 (degrees) when the external magnetic field is zero. As one of such methods, there is a method of using the barber pole electrode structure.

Figure 5:
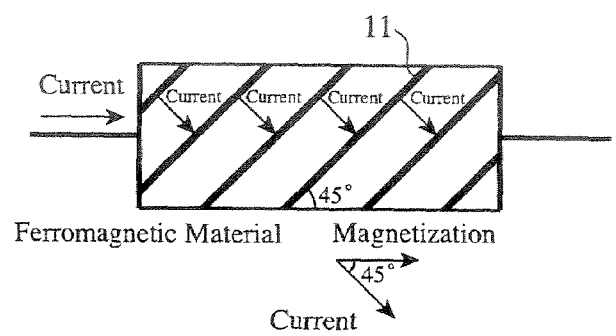
FIG. 5 is a view illustrating a barber pole electrode structure.

FIG. 5 is a diagram illustrating the barber pole electrode structure. In FIG. 5, aluminum electrodes 11 are inclined 45 (degrees) with respect to the axial direction of the magnetoresistive element.

As is seen from FIG. 5, the barber pole electrodes are provided to incline the direction of the current flowing through the surface of the magnetoresistive element by 45 (degrees). Since the potentials in the individual aluminum electrodes 11 are equal, the current flows in the direction perpendicular to the aluminum electrodes 11. When the ferromagnetic material is magnetized in the axial direction, the angle θ between the direction of the magnetization and the direction of the current can be made 45 (degrees) when the external magnetic field is zero.

In the measured current detecting section 1 shown in FIG. 1, the three magnetoresistive elements 5a are provided with the aluminum electrodes 11 with the inclination of −45 (degrees) with respect to the direction of the current. Likewise, the three magnetoresistive elements 5c are provided with the aluminum electrodes 11 with the inclination of −45 (degrees) with respect to the direction of the current. In addition, the three magnetoresistive elements 5b are provided with the aluminum electrodes 11 with the inclination of +45 (degrees) with respect to the direction of the current. Likewise, the three magnetoresistive elements 5d are provided with the aluminum electrodes 11 with the inclination of +45 (degrees) with respect to the direction of the current.

Thus forming the barber pole electrode structure makes it possible to implement the following configuration. Assume in FIG. 1 that an external magnetic field is applied to the magnetoresistive elements 5a and 5b from the left side to the center line 3, and an external magnetic field is applied to the magnetoresistive elements 5c and 5d from the right side to the center line 3. In this case, such a configuration is implemented in which the magnetoresistive elements 5a and 5d have the magnetoresistive characteristics of increasing the resistances with an increase in the external magnetic field and reducing the resistances with the reduction in the external magnetic field, and in which the magnetoresistive elements 5b and 5c have the opposite magnetoresistive characteristics of reducing the resistances with an increase in the external magnetic field and increasing the resistances with the reduction in the external magnetic field. Although aluminum is used for the electrodes, other metal materials with low resistivity can also be used.

Next, the mounting method of the current sensor will be described.

Figure 6:
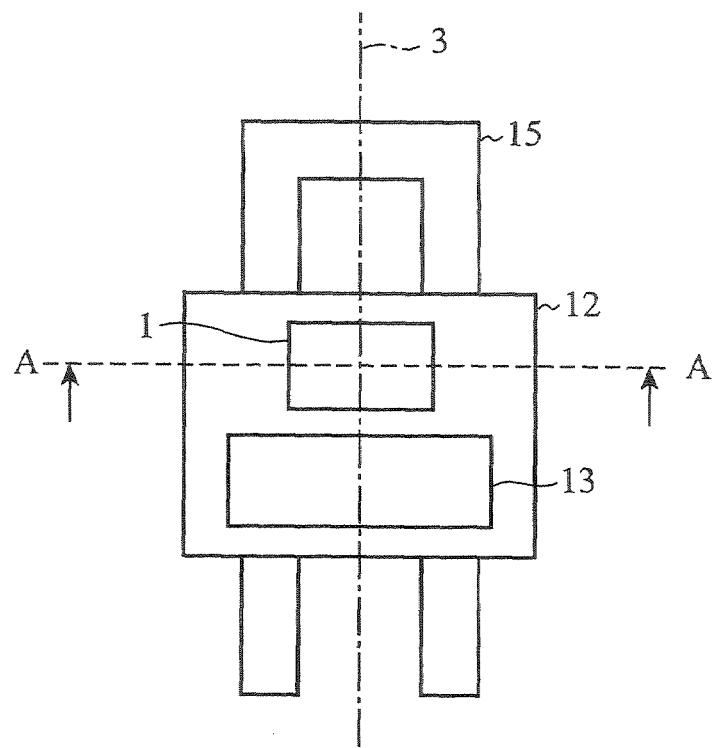
FIG. 6 is a schematic structural diagram showing a mounting method of the current sensor of the embodiment 1 in accordance with the present invention.
Figure 7:
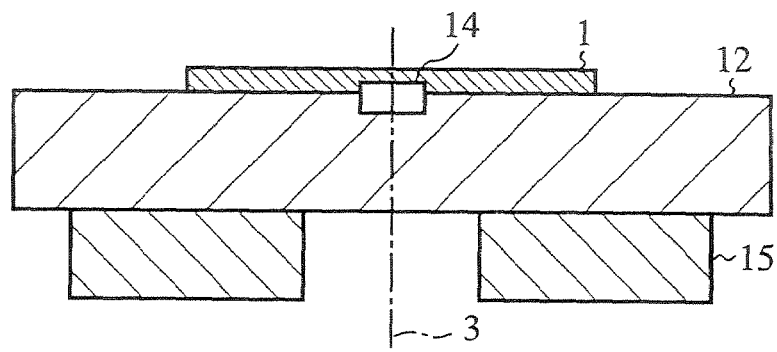
FIG. 7 is a cross-sectional view showing a section taken along A-A line of FIG. 6.

FIG. 6 is a schematic structural diagram showing a mounting method of the current sensor of the embodiment 1 in accordance with the present invention; and FIG. 7 is a cross-sectional view showing the section taken along A-A line of FIG. 6. In FIGS. 6 and 7, the measured current detecting section 1 as shown in FIG. 1 is mounted on an insulation base 12. In this case, the measured current detecting section 1 is fixed to the base 12 at a single bonding portion 14 near the central point 4. In addition, the control circuit 13 is mounted on the base 12. As described above, the control circuit 13 supplies the connecting areas 9a and 9b of the measured current detecting section 1 with the voltage of the bridge circuit 8. Besides, according to the voltage of the bridge circuit 8 detected across the connecting areas 9c and 9d, the control circuit 13 supplies the connecting areas 9e and 9f of the measured current detecting section 1 with such a control current that will counteract the magnetic field generated near the four magnetoresistive elements 5a-5d.

Furthermore, the base 12 is mounted on the current line 15 to be measured. Here the current line 15 to be measured is assumed to have a U-like structure. In this case, the U-like current line 15 to be measured is mounted in such a manner that its two current lines 15 to be measured have symmetry with respect to the center line 3 of the measured current detecting section 1, and that the axial direction of the two current lines 15 to be measured is nearly parallel to the center line 3.

Next, the current measuring method of the current sensor will be described.

In the condition that the base 12 is mounted on the U-like current line 15 to be measured as shown in FIG. 6, and that no current is flowing through the current line 15 to be measured, a specified voltage is supplied between the connecting areas 9a and 9b of the measured current detecting section 1 as shown in FIG. 1 from the control circuit 13. In this case, the variable magnetoresistive element portions 10a and 10b are cut with a laser or the like in such a manner that the voltage detected between the connecting areas 9c and 9d of the measured current detecting section 1 by the control circuit 13 becomes zero. Thus, the resistances of the four magnetoresistive elements 5a-5d are fine adjusted, and the bridge circuit 8 is balanced. The balance processing of the bridge circuit 8 using the variable magnetoresistive element portions 10a and 10b can be made before the shipment of the current sensor.

Next, a current is passed through the U-like current line 15 to be measured. The current flowing through the U-like current line 15 to be measured generates clockwise magnetic fields with respect to the direction of the current around the two current lines 15 to be measured in proportion to the magnitude of the current. Accordingly, in the measured current detecting section 1 in FIG. 1, for example, the magnetoresistive elements 5a and 5b are applied with the external magnetic field from the left side to the center line 3, and the magnetoresistive elements 5c and 5d are applied with the external magnetic field from the right side to the center line 3.

As describe above, the configuration is implemented in such a manner that the magnetoresistive elements 5a and 5d have the magnetoresistive characteristics of increasing the resistances with an increase in the external magnetic field and reducing the resistances with the reduction in the external magnetic field, and that the magnetoresistive elements 5b and 5c have the opposite magnetoresistive characteristics of reducing the resistances with an increase in the external magnetic field and increasing the resistances with the reduction in the external magnetic field.

Accordingly, in accordance with an increase of the current flowing through the U-like current line 15 to be measured, the resistances of the magnetoresistive elements 5a and 5d increase, and the resistances of the magnetoresistive elements 5b and 5c reduce. In contrast, in accordance with the reduction of the current flowing through the U-like current line 15 to be measured, the resistances of the magnetoresistive elements 5a and 5d reduce, and the resistances of the magnetoresistive elements 5b and 5c increase.

Thus, in accordance with the magnitude of the current flowing through the U-like current line 15 to be measured, the balance of the bridge circuit 8 is lost. In this case, in response to the voltage detected between the connecting areas 9c and 9d of the measured current detecting section 1, the control circuit 13 supplies the connecting areas 9e and 9f of the measured current detecting section 1 with the control current that will counteract the magnetic field generated near the four magnetoresistive elements 5a-5d. More specifically, the control circuit 13 adjusts the magnitude of the control current in such a manner that the voltage detected between the connecting areas 9c and 9d becomes zero. The compensating conductive line 16 connected to the connecting areas 9e and 9f generates such a magnetic field that will cancel the magnetic field generated near the four magnetoresistive elements 5a-5d in response to the magnitude of the control current, that is, the magnetic field corresponding to the magnitude of the current flowing through the U-like current line 15 to be measured.

Thus, the thrown off balance of the bridge circuit 8 corresponding to the magnitude of the current flowing through the U-like current line 15 to be measured can be restored by the control current fed from the control circuit 13.

Accordingly, the magnitude of the control current supplied from the control circuit 13 to the connecting areas 9e and 9f can be detected in terms of the magnitude of the current flowing through the U-like current line 15 to be measured, or in terms of a value having correlation with the magnitude of the current flowing through the U-like current line 15 to be measured.

Incidentally, as for disturbance magnetic field generated by a cause other than the U-like current line 15 to be measured, since it has the same phase influence on the individual half bridge circuits 7a and 7b, it is canceled out and has no adverse effect on the measurement accuracy.

In such a configuration, the half bridge circuits 7a and 7b, which are composed of the four magnetoresistive elements 5a-5d and connecting current lines 6 constituting the bridge circuit 8 as shown in FIG. 1, are placed point symmetrically about the central point 4; the connecting areas 9a and 9b are placed point symmetrically about the central point 4; the connecting areas 9c and 9d are placed point symmetrically about the central point 4; the connecting areas 9e and 9f are placed point symmetrically about the central point 4; the magnetoresistive element portions 10a and 10b are placed point symmetrically about the central point 4; and the connecting current line 6 connecting the connecting area 9c and the magnetoresistive elements 5a and 5b and the connecting current line 6 connecting the connecting area 9d and the magnetoresistive elements 5c and 5d are placed point symmetrically about the central point 4.

In addition, as shown in FIG. 7, the current sensor is mounted in such a manner that the measured current detecting section 1 is fixed to the base 12 at the single bonding portion 14 near the central point 4.

Accordingly, if temperature or the like causes elongation or strain isotropically in the mounting substrate 2 of the magnetoresistive elements 5a-5d, the half bridge circuit 7a and half bridge circuit 7b are affected by the elongation or strain equally as the bridge circuit 8 in its entirety. Thus, their effects can be canceled out, and a measurement error due to the isotropic elongation or strain because of the temperature and the like can be reduced.

Although the foregoing embodiment 1 is described by way of example including four magnetoresistive elements 5a-5d, each having three magnetoresistive elements formed in a crank-like shape, they are not limited to the three magnetoresistive elements. A single or a plurality of magnetoresistive elements other than three can also be used. In addition, they are not limited to the crank-like shape. For example, as long as they have a long line length for receiving the magnetic field to facilitate the detection of the variations in the magnetic field perpendicular to the center line 3 of the mounting substrate 2, any shape can offer a similar advantage.

Although the foregoing embodiment 1 is described by way of example in which six connecting areas 9a-9f are placed at the top and bottom of the magnetoresistive elements 5a-5d, they are not limited to the top and bottom. For example, as long as they are placed point symmetrically about the central point 4, they can be placed at any locations at the right and left or at the center of the magnetoresistive elements 5a-5d, offering a similar advantage.

In addition, although the foregoing embodiment 1 describes the method of measuring the magnitude of the current flowing through the U-like current line 15 to be measured, it is not limited to the U-like current line 15 to be measured. For example, it is applicable to any two current lines to be measured, which are placed in parallel and pass the same magnitude of currents in the opposite direction, offering a similar advantage.

As described above, the present embodiment 1 is configured in such a manner that the half bridge circuit 7a is placed in the first side of the two divided by the center line 3 of the mounting substrate 2 and the half bridge circuit 7b is placed in the second side, and that the half bridge circuits 7a and 7b are placed point symmetrically with respect to the central point 4 of the mounting substrate 2. Accordingly, even if elongation or strain occurs isotropically in the mounting substrate 2 of the magnetoresistive elements 5a-5d owing to the temperature or the like, the half bridge circuit 7a and half bridge circuit 7b undergo the influence of the elongation or strain equally as the bridge circuit 8, thereby being able to cancel out the effect and to reduce the measurement error due to the isotropic elongation or strain owing to the temperature or the like.

In addition, the present embodiment 1 is configured in such a manner that the compensating conductive line 16 is placed at the top or bottom or both of the magnetoresistive elements 5a-5d via the insulating layer, and that in response to the voltage of the bridge circuit 8 detected between the connecting areas 9c and 9d, the control circuit 13 supplies the connecting areas 9e and 9f with such a control current that will counteract the magnetic field generated near the magnetoresistive elements 5a-5d. The balance type configuration thus constructed can improve the measurement accuracy.

Furthermore, the connecting areas 9a and 9b are equally formed and placed point symmetrically with respect to the central point 4 of the mounting substrate 2; the connecting areas 9c and 9d are equally formed and placed point symmetrically with respect to the central point 4 of the mounting substrate 2; and the connecting areas 9e and 9f are equally formed and placed point symmetrically with respect to the central point 4 of the mounting substrate 2. Accordingly, even if elongation or strain occurs isotropically in the mounting substrate 2 owing to the temperature or the like, the connecting area 9a and connecting area 9b are equally affected by the elongation or strain, the connecting area 9c and connecting area 9d are equally affected by the elongation or strain, and the connecting area 9e and connecting area 9f are equally affected by the elongation or strain. Thus, the present embodiment 1 can reduce the measurement error due to the isotropic elongation or strain owing to the temperature or the like.

In addition, the magnetoresistive elements 5a-5d are configured in such a manner as to be placed in parallel with the center line 3 of the mounting substrate 2. Thus, the present embodiment 1 is applicable to the current measurement of the U-like current line 15 to be measured.

Furthermore, the present embodiment 1 is configured in such a manner as to include the magnetoresistive element portions 10a and 10b whose resistances are adjustable at the two connecting sections of the half bridge circuit 7a and half bridge circuit 7b. This enables previous fine adjustment of the resistances of the magnetoresistive elements 5a-5d, thereby being able to improve the measurement accuracy.

Moreover, the present embodiment 1 is configured in such a manner that the two current lines 15 to be measured in the U-like current line 15 to be measured are placed symmetrically with respect to the center line 3 of the mounting substrate 2 of the current sensor; that the axial direction of the two current lines 15 to be measured becomes approximately parallel to the center line 3 of the mounting substrate 2; and that the current sensor is fixed at the central point 4 of the mounting substrate 2. Accordingly, the present embodiment 1 can reduce the measurement error due to the isotropic elongation or strain owing to the temperature and the like, and improve the measurement accuracy of the current flowing through the current line 15 to be measured in the U-like current line 15 to be measured.

Embodiment 2

Figure 8:
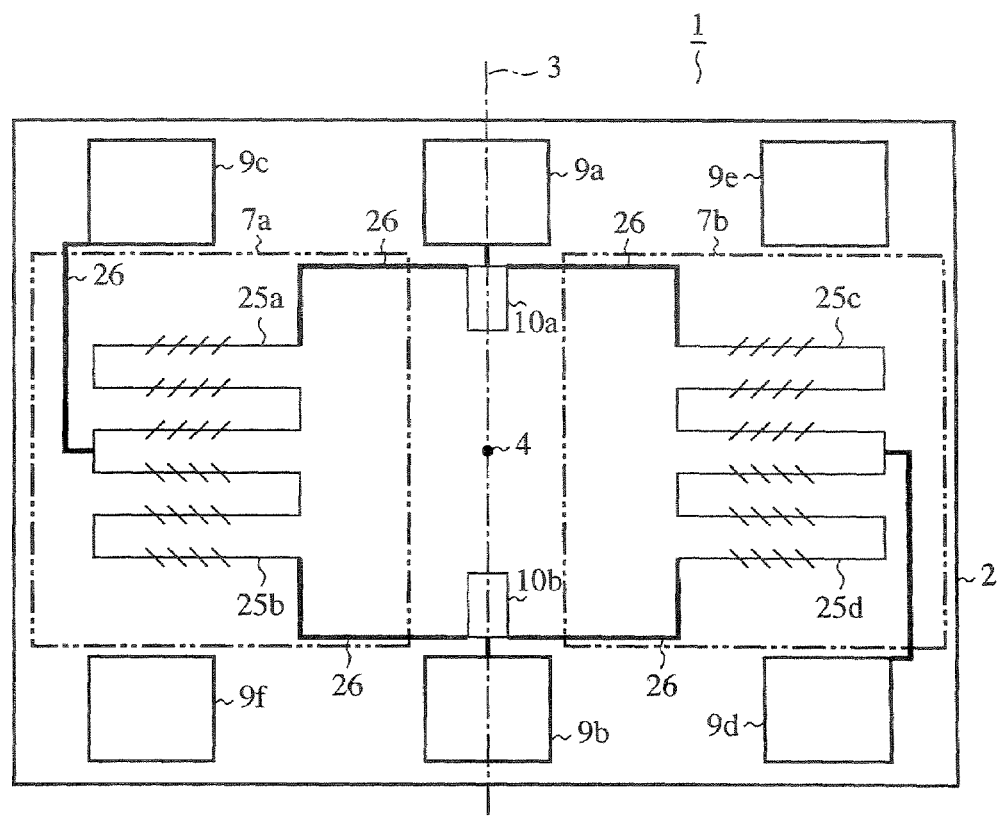
FIG. 8 is a plan view showing the measured current detecting section of the current sensor of an embodiment 2 in accordance with the present invention.

FIG. 8 is a plan view showing the measured current detecting section of the current sensor of an embodiment 2 in accordance with the present invention. In FIG. 8, four magnetoresistive elements (first to fourth magnetoresistive elements) 25a-25d are placed perpendicularly to the center line 3 of the mounting substrate 2; and a barber pole electrode structure is formed in such a manner that the magnetoresistive elements 25a and 25d have magnetoresistive characteristics of increasing the resistances with an increase of the magnetic fields opposite to each other in directions, and that the magnetoresistive elements 25b and 25c have magnetoresistive characteristics of reducing the resistances with an increase of the magnetic fields opposite to each other in directions.

Connecting current lines 26 constitute the bridge circuit by interconnecting the four magnetoresistive elements 25a-25d.

In the configuration shown in FIG. 8, the individual counterparts on the mounting substrate 2 are equally formed and placed point symmetrically with respect to the central point 4 of the mounting substrate 2.

More specifically, the half bridge circuits 7a and 7b, which are composed of the four magnetoresistive elements 25a-25d and connecting current lines 6 constituting the bridge circuit 8, are placed point symmetrically about the central point 4; the connecting areas 9a and 9b are placed point symmetrically about the central point 4; the connecting areas 9c and 9d are placed point symmetrically about the central point 4; the connecting areas 9e and 9f are placed point symmetrically about the central point 4; the magnetoresistive element portions 10a and 10b are placed point symmetrically about the central point 4; and the connecting current line 26 connecting the connecting area 9c and the magnetoresistive elements 25a and 25b and the connecting current line 26 connecting the connecting area 9d and the magnetoresistive elements 25c and 25d are placed point symmetrically about the central point 4.

Since the remaining configuration is the same as that of FIG. 1, its duplicated description will be omitted here.

Next, the operation will be described.

The foregoing embodiment 1 is described by way of example having the four magnetoresistive elements 5a-5d arranged in parallel with the center line 3 of the mounting substrate 2 as shown in FIG. 1. In such an arrangement, the magnetoresistive elements 5a-5d are insensitive to a magnetic field parallel to the center line 3.

To be sensitive to the magnetic field parallel to the center line 3, the four magnetoresistive elements 25a-25d are placed perpendicularly to the center line 3 of the mounting substrate 2 as shown in FIG. 8.

Next, the mounting method of the current sensor will be described.

Figure 9:
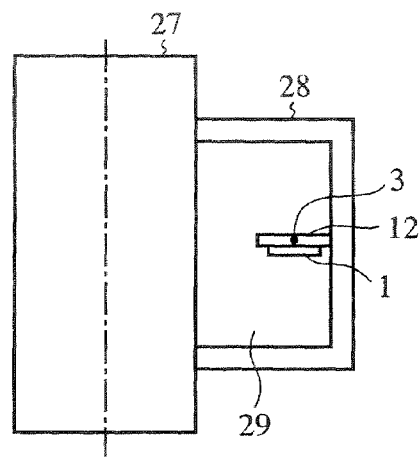
FIG. 9 is a schematic structural diagram showing a mounting method of the current sensor of the embodiment 2 in accordance with the present invention.

FIG. 9 is a schematic structural diagram showing a mounting method of the current sensor of the present embodiment 2 in accordance with the present invention. As described in connection with FIG. 6 and FIG. 7, the measured current detecting section 1 shown in FIG. 8 is placed on the insulation base 12. In this case, the measured current detecting section 1 is fixed to the base 12 at the single bonding portion 14 near the central point 4. In addition, the control circuit 13 is mounted on the base 12.

In FIG. 9, a current line 27 to be measured has an asymmetric shunt 28. At the point at which the magnetic force becomes zero in a hollow section 29 of the shunt 28 of the shunt type current line 27 to be measured, the measured current detecting section 1 shown in FIG. 8 is mounted in such a manner that the center line 3 is brought on the point at which the magnetic force becomes zero, and that the axial direction of the current line 27 to be measured becomes nearly perpendicular to the center line 3 of the mounting substrate 2.

In the current measurement of the current line 27 to be measured having the asymmetric shunt 28, the hollow section 29 formed by the current line 27 to be measured and the shunt 28 has the point at which the magnetic field generated by the current flowing through the current line 27 to be measured and shunt 28 is canceled out and becomes zero. Accordingly, mounting the measured current detecting section 1 in such a manner that the center line 3 comes on the point at which the magnetic force becomes zero makes it possible to improve the measurement accuracy of the current flowing through the shunt type current line 27 to be measured.

In addition, the measured current detecting section 1 is mounted on the shunt type current line 27 to be measured having the asymmetric shunt 28. Accordingly, when a shunt ratio of the current flowing through the current line 27 to be measured and the current flowing through the shunt 28 is 9:1, for example, it is enough to measure only 1/10 current compared with the case where the current flowing through the current line 27 to be measured is measured directly. This enables miniaturization of the capacitance and the like of the control circuit 13. In other words, a large current can be measured with a smaller current sensor.

In such a configuration, the half bridge circuits 7a and 7b, which are composed of the four magnetoresistive elements 25a-25d and connecting current lines 26 constituting the bridge circuit 8 as shown in FIG. 8, are placed point symmetrically about the central point 4; the connecting areas 9a and 9b are placed point symmetrically about the central point 4; the connecting areas 9c and 9d are placed point symmetrically about the central point 4; the connecting areas 9e and 9f are placed point symmetrically about the central point 4; the magnetoresistive element portions 10a and 10b are placed point symmetrically about the central point 4; and the connecting current line 26 connecting the connecting area 9c and the magnetoresistive elements 25a and 25b and the connecting current line 26 connecting the connecting area 9d and the magnetoresistive elements 25c and 25d are placed point symmetrically about the central point 4.

In addition, as shown in FIG. 7, the current sensor is mounted in such a manner that the measured current detecting section 1 is fixed to the base 12 at the single bonding portion 14 near the central point 4.

Accordingly, even if temperature or the like causes elongation or strain isotropically in the mounting substrate 2 of the magnetoresistive elements 25a-25d, the half bridge circuit 7a and half bridge circuit 7b are affected by the elongation or strain equally as the bridge circuit 8 in its entirety. Thus, their effects can be canceled out, and a measurement error due to the isotropic elongation or strain because of the temperature and the like can be reduced.

As described above, in addition to the advantages of the foregoing embodiment 1, the present embodiment 2 is configured in such a manner that the magnetoresistive elements 25a-25d are placed perpendicularly to the center line 3 of the mounting substrate 2. Thus, the present embodiment 2 is applicable to the current measurement of the shunt type current line 27 to be measured.

In addition, the present embodiment 2 is configured such that the current sensor is fixed at the central point 4 of the mounting substrate 2 in such a manner that the center line 3 of the mounting substrate 2 of the measured current detecting section 1 is brought on the point at which the magnetic force becomes zero in the hollow section 29 of the shunt 28 of the shunt type current line 27 to be measured, and that the axial direction of the current line 27 to be measured becomes nearly perpendicular to the center line 3 of the mounting substrate 2. Thus, the present embodiment 2 can not only reduce the measurement error due to the isotropic elongation or strain owing to the temperature and the like, but also improve the measurement accuracy of the current flowing through the current line 27 to be measured of the shunt type current line 27 to be measured, and facilitate large current measurement.

Embodiment 3

Figure 10:
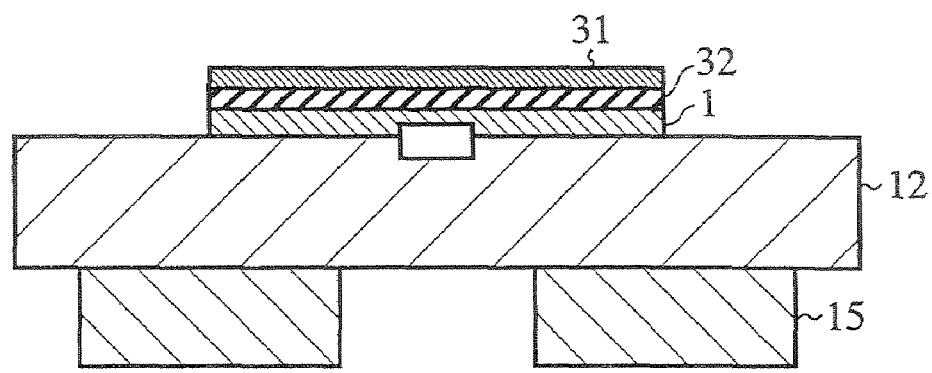
FIG. 10 is a cross-sectional view showing the current sensor of an embodiment 3 in accordance with the present invention.

FIG. 10 is a cross-sectional view showing a current sensor of an embodiment 3 in accordance with the present invention. In FIG. 10, an electric field shield layer (electric field shield cover) 31 covers the measured current detecting section 1 via an insulating layer 32. Since the remaining configuration is the same as that of FIG. 7, its duplicated description will be omitted here.

Next, the operation will be described.

As shown in FIG. 10, to shield the measured current detecting section 1 from a disturbance electric field, it is covered with the electric field shield layer 31 via the insulating layer 32.

The electric field shield layer 31, which is composed of an electrically conductive nonmagnetic material, is grounded although not shown in FIG. 10. Although only the measured current detecting section 1 is covered in the present embodiment 3, a case-like electric field shield cover can also be used which covers the whole device including the base 12. Providing such an electric field shield layer 31 to the current sensor makes it insensitive to the electric noise at the mounting location, and enables shielding from the disturbance electric field, thereby improving the current detection accuracy.

Although the present embodiment 3 is described by way of example in which the measured current detecting section 1 shown in the foregoing embodiment 1 is covered with the electric field shield layer 31, it is also possible to cover the measured current detecting section 1 shown in the foregoing embodiment 2 with the electric field shield layer 31, offering a similar advantage.

As described above, the present embodiment 3 is configured in such a manner as to be provided with the electric field shield layer 31. Accordingly, the present embodiment 3 can eliminate the effect of the disturbance electric field and improve the measurement accuracy.

What is claimed is:

1. A current sensor comprising:
   first and fourth magnetoresistive elements which are placed on a mounting substrate, and have magnetoresistive characteristics of increasing resistances in accordance with increases in magnetic fields opposite in directions to each other;
   second and third magnetoresistive elements which are placed on the mounting substrate, and have magnetoresistive characteristics of reducing resistances in accordance with increases of the magnetic fields opposite in directions to each other; and
   connecting current lines, which are placed on the mounting substrate, and construct a bridge circuit including a first half bridge circuit and a second half bridge circuit by connecting said first to fourth magnetoresistive elements, said first half bridge circuit including said first and second magnetoresistive elements, and said second half bridge circuit including said third and fourth magnetoresistive elements,
   wherein said first half bridge circuit is placed in a first region of two regions formed by dividing said mounting substrate by a center line, said second half bridge circuit is placed in a second region of the two regions, and said first and second half bridge circuits are equally formed and placed point symmetrically with respect to a central point of the mounting substrate.

2. The current sensor according to claim 1, comprising:
   a first connecting area which is placed on the mounting substrate and is connected between the first and third magnetoresistive elements of said bridge circuit;
   a second connecting area which is placed on the mounting substrate and is connected between the second and fourth magnetoresistive elements of said bridge circuit, said first connecting area and said second connecting area supplying a voltage to said bridge circuit;
   a third connecting area which is placed on the mounting substrate and is connected between the first and second magnetoresistive elements of said bridge circuit; and
   a fourth connecting area which is placed on the mounting substrate and is connected between the third and fourth magnetoresistive elements of said bridge circuit, said third connecting area and said fourth connecting area detecting a voltage from said bridge circuit, wherein
   said first and second connecting areas are equally formed and placed point symmetrically with respect to the central point of said mounting substrate; and
   said third and fourth connecting areas are equally formed and placed point symmetrically with respect to the central point of said mounting substrate.

3. The current sensor according to claim 2, further comprising:
   a compensating conductive line which is placed at the top, bottom or both of the first to fourth magnetoresistive elements on the mounting substrate via an insulating layer;
   a fifth connecting area which is placed on said mounting substrate and is connected to a first end of said compensating conductive line;
   a sixth connecting area which is placed on said mounting substrate and is connected to a second end of said compensating conductive line; and
   a control circuit of supplying the first and second connecting areas with the voltage, and for supplying the fifth and sixth connecting areas with a control current that will counteract a magnetic field generated near the first to fourth magnetoresistive elements in response to the voltage detected from the third and fourth connecting areas, wherein
   said fifth and sixth connecting areas are equally formed and placed point symmetrically with respect to the central point of said mounting substrate.

4. The current sensor according to claim 1, further comprising an electric field shield cover for eliminating disturbance electric field.

5. The current sensor according to claim 1, wherein said first to fourth magnetoresistive elements are placed in parallel with the center line of the mounting substrate.

6. The current sensor according to claim 1, wherein said first to fourth magnetoresistive elements are placed perpendicularly to the center line of the mounting substrate.

7. The current sensor according to claim 1, further comprising magnetoresistive element portions which enable resistance adjustment at two connecting sections of the first half bridge circuit and second half bridge circuit.

8. A mounting method of a current sensor of fixing the current sensor of claim 5 to a mounting substrate at a central point of the mounting substrate in such a manner that two current lines to be measured, which are placed in parallel and pass a same magnitude of currents in opposite directions, are symmetric with respect to a center line of the mounting substrate, and that an axial direction of the two current lines to be measured is substantially parallel with the center line of the mounting substrate.

9. A mounting method of a current sensor of fixing the current sensor of claim 6 to a mounting substrate at a central point of the mounting substrate in such a manner that a center line of the mounting substrate of the current sensor is brought to a point, at which a magnetic force of a hollow section becomes zero, the hollow section being formed by a current line to be measured and an asymmetric shunt attached to the current line to be measured, and that an axial direction of the current line to be measured is substantially perpendicular to the center line of the mounting substrate.

* * * * *